United States Patent

[11] 3,591,839

[72] Inventor Arthur D. Evans
Saratoga, Calif.
[21] Appl. No. 853,416
[22] Filed Aug. 27, 1969
[45] Patented July 6, 1971
[73] Assignee Siliconix, Inc.
Sunnyvale, Calif.

[54] MICRO-ELECTRONIC CIRCUIT WITH NOVEL HERMETIC SEALING STRUCTURE AND METHOD OF MANUFACTURE
11 Claims, 5 Drawing Figs.

[52] U.S. Cl. .......... 317/234, 317/235, 174/52, 29/588, 174/68.5, 29/589, 29/591
[51] Int. Cl. .......... H01l 3/00, H01l 5/00, H01l 7/00
[50] Field of Search .......... 317/234; 29/588, 589, 591; 174/52, 68.5

[56] References Cited
UNITED STATES PATENTS

| | | | |
|---|---|---|---|
| 3,403,438 | 10/1968 | Best et al. | 29/577 |
| 3,429,040 | 2/1969 | Miller | 29/626 |
| 3,456,159 | 7/1969 | Davis et al. | 317/101 |
| 3,517,278 | 6/1970 | Hager | 317/234 |
| 3,517,279 | 6/1970 | Ikeda et al. | 317/234 |

*Primary Examiner*—John W. Huckert
*Assistant Examiner*—B. Estrin
*Attorney*—Giles C. Clegg, Jr.

ABSTRACT: A semiconductor device wherein a semiconductor chip having an active element formed in a limited area is bonded to an insulating substrate with the chip spaced apart form the substrate and the active area hermetically sealed within the region defined by the insulating substrate, the body of the chip and the sealing ring. Conductive lands formed on the surface of the substrate pass beneath an insulating ring which is part of the sealing structure. Contact pads formed on the semiconductor chip electrically contact the conductive lands for providing electrical contact to the required areas of the active device.

INVENTOR
ARTHUR D. EVANS

ATTORNEY

MICRO-ELECTRONIC CIRCUIT WITH NOVEL HERMETIC SEALING STRUCTURE AND METHOD OF MANUFACTURE

BACKGROUND OF THE INVENTION

The present invention relates to microelectronic circuits and, more particularly, to microelectronic circuits in which chips of semiconductor material having active elements defined therein are connected directly to a substrate upon which a microelectronic circuit is formed.

Microelectronic circuits are commonly produced by providing thin or thick film components and conductors on a surface of a substrate and then connecting chips of semiconductor material having active elements defined therein directly to the substrate. The semiconductor chip may have a single active element, such as a diode, transistor, or field effect transistor defined therein or maybe a more complicated integrated circuit having several active and passive elements defined therein.

Connection of semiconductor components to the substrate of the chip or diode without encasing the chip in a hermetically sealed container or plastic material is generally considered advantageous because it reduces the possibility of damaging the chip in the encapsulating and encasing operation. Wires or other freely floating conductors are not required, thereby eliminating a frequent cause of defects in the completed semiconductor device and in the microelectronic circuit itself.

The commonly used chips which are connected directly to the substrates are passivated or coated with glass to prevent environmental conditions effecting the device characteristics. Although such coatings provide a certain degree of protection, in general, the best device characteristics are obtained when the chip is hermetically sealed in addition to the protective coating.

SUMMARY OF THE INVENTION

The present invention provides a semiconductor device and method in which a semiconductor component, such as a diode, transistor, field effect transistor, or integrated circuit is connected directly to a substrate while in chip form wherein the active regions of the device are hermetically sealed. In accordance with the present invention, the desired elements are defined in one surface of the semiconductor chip using conventional masking and diffusion techniques. Thereafter, the chip processed in the normal manner through the conventional formation of contact pads and connection of the elements to the contact pads. In accordance with the present invention, bumps of either solder or aluminum are provided on the contact pads of the chips. A ring of bondable material is deposited on the surface of the chip which encloses a limited area containing the contact pads and all active regions of the semiconductor component. A substrate of insulating material is prepared by applying to it conductive lands for making contact to the contact pads on the semiconductor chip. A ring of insulating material is then deposited onto the substrate over the lands with the ring of insulating material enclosing the area to which the semiconductor chip is to be bonded. A ring of bondable material is applied over the ring of insulating material with the ring of bondable material conforming in size and shape to the ring of bondable material applied to the semiconductor chip. The semiconductor chip is inverted onto the substrate and positioned so that the contact bumps mate with the contact pads or lands on the substrate and the two rings of bondable material are in opposed relationship. Energy in the form of heat and/or ultrasonic energy is then applied for the purpose of bonding the two rings of bondable material together and bonding the contact bumps to the contact pads or lands on the substrate. The active or critical regions of the device are thereby hermetically sealed within an area defined by the semiconductor chip, the substrate, and the ring of insulating material.

DESCRIPTION OF THE DRAWINGS

Many objects and advantages of the invention will become apparent to those skilled in the art as a detailed description of the invention enfolds in conjunction with the appended drawings wherein like reference numerals denote like parts and in which.

DESCRIPTION OF THE PREFERRED EMBODIMENT

Figures 1, 2:
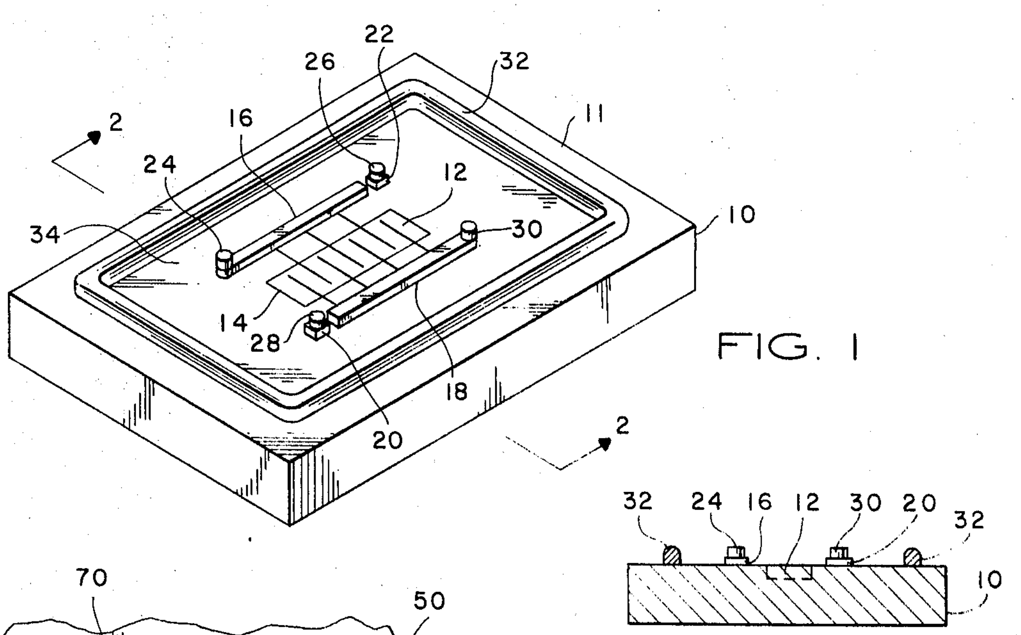
FIG. 1 is a perspective view of a semiconductor chip prepared in accordance with the principles of the present invention.
FIG. 2 is a view in cross section taken along line 2 to FIG. 1.

A semiconductor chip 10 prepared in accordance with the present invention as shown in FIG. 1 of the drawings. Thus, a plurality of chips can be fabricated from a single slice of semiconductor material with each chip having an active region 12 formed by conventional diffusion, masking and passivation techniques. Preferably, the active region 12 is bonded by a guard ring 14 for limiting the critical region of the chip. Conventional plating or evaporation techniques and metal-etching techniques can then be used to provide contact pads 16, 18, 20, and 22 on the surface of the chip for connecting the regions to appropriate ones of the contact pads. In the specific example of the invention shown in FIG. 1 of the drawings, the active region 12 defines a field effect transistor in which a source connection is made to the pad 16, a drain connection is made to the pad 18 and gate connections are made to the pads 20 and 22. Contact bumps 24, 26, 28, and 30 are associated with the pads 16, 18, 20, and 22, respectively. The contact bumps can either be formed from solder or of aluminum. Their size is not critical, but it has been found that bumps in the order of 0.003 inch to 0.005 inch in diameter and about 0.001 inch high do provide good results. A contact ring 32 of bondable material, preferably solder, is applied to the surface 11 of the chip with the contact ring 32 bounding a limited area 34 on the surface of the chip in which the contact pads and the active areas of the chip are contained. The contact ring 32 is suitably of the approximate height as the contact bumps. The units are then die sorted to provide assurance that the individual chips meet the necessary test specifications. It will be noted that all of the above steps are performed, preferably, while the chip is a part of a larger slice containing many chips. The slice is then cut into individual chips as shown in FIG. 1 using conventional methods, such as sawing or scribing and breaking.

Figure 3:
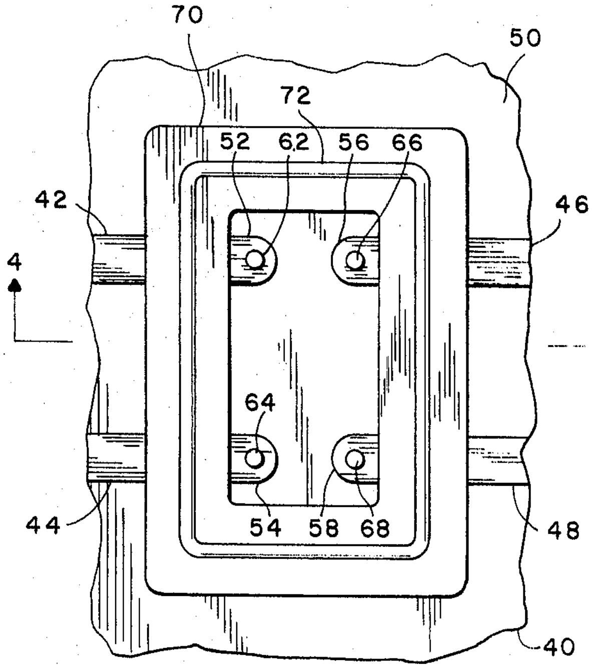
FIG. 3 is a plan view of a portion of a substrate prepared in accordance with the present invention.
Figure 4:
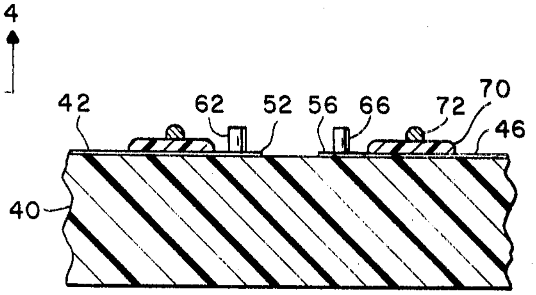
FIG. 4 is a cross-sectional view taken along line 4—4 of FIG. 3.

A substrate suitable for use in the practice of the present invention is shown in FIGS. 3 and 4 of the drawings. The substrate, designated generally by the reference character 40, is of a suitable insulating material, such as glass, ceramic, plastic, or like material. It will be appreciated that the substrate 40 will be much longer than that shown in the drawings as only a limited portion of the substrate is illustrated. In practice, the substrate will be of a sufficient size to accommodate several chips of semiconductor material. A plurality of conductive lands, such as the lands 42, 44, 46, and 48 are provided on the surface 50 of the substrate 40. The metallic lands can be formed on the substrate using conventional evaporation techniques or other known methods, with each of the lands 42, 44, 46, and 48 terminating in contact areas 52, 54, 56, and 58, respectively. If desired, contact bumps 62, 64, 66, and 68 can be provided on the contact areas, but such are not required. It will be noted that the spacial relationship between the contact areas 52, 54, 56, and 58 corresponds to the spacial relationship between the contact bumps 24, 26, 28, and 30.

A ring of insulating material 70 is applied to the surface 50 of the substrate and overlying the conductive lands 42, 44, 46, and 48. It will be noted that the contact areas 52, 54, 56, and 58 of the conductive lands are enclosed within an area bounded by the ring of insulating material 70. The ring 70 of insulating material is suitably of glass having a coefficient of thermal expansion near that of the substrate and semiconductor material and deposited using conventional techniques. A ring 72 of bondable material is then applied over the ring 70 of insulating material with the ring 70 electrically insulating the ring 72 from the conductive lands. The ring 72 corresponds dimensionally to the ring 32 formed on the surface 11 of the semiconductor chip 10 and has the same spacial relationship to the contact bumps 62, 64, 66, and 68 as the ring 32 has to the contact bumps 24, 26, 28, and 30.

After preparation of the chip 10 and the substrate 40, the chip is inverted such that the surface 11 is in opposing relationship to the surface 50 of the substrate and the chip positioned over a preselected position on the substrate with its ring 32 in opposing relationship to the ring 72 formed on the substrate. When in this position, the respective contact pads and bumps will be aligned. Energy is then applied for fusing the ring 32 to the ring 72 and for fusing the bumps 24, 26, 28, and 30 to the associated pad on the substrate. It will be noted that if the bumps and rings are of solder, that only heat is required, although a small amount of pressure may also be desirable. However, if the bumps or rings are of aluminum, ultrasonic energy will be required to produce the desired bonding. The character of the energy applied will, therefore, depend upon the particular material to be fused.

Figure 5:
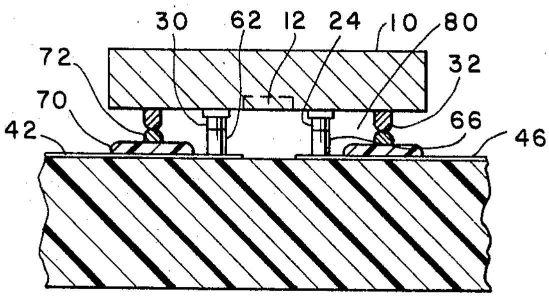
FIG. 5 is a cross-sectional view showing the chip of FIG. 2 connected to the substrate of FIG. 4.

Upon completion of the above operation, a structure as shown in FIG. 5 will be provided. It will be noted that the active region 12 of the chip 10 is hermetically enclosed within an area 80 bound by the chip, the substrate, the insulating ring, and the sealing rings. The lands used for making contact to the active regions of the device are electrically insulated from one another but electrically connected to the associated region of the device.

The above-described invention provides a microelectronic circuit of increased utility due to the increase in reliability obtained by hermetically sealing the active regions of the semiconductor chip and permits use of the microelectronic circuitry in environmental conditions for a chip not hermetically sealed would not be acceptable. Further, since the chip is supported about its entire periphery, the advantage of greater physical strength is obtained.

What I claim is:

1. A method for sealing semiconductor components to a substrate at the chip level comprising the steps of:

a. creating at least one component in a surface of a chip of semiconductor material;

b. providing pads of bondable, conductive material on said surface in a predetermined pattern;

c. electrically connecting each active region of said component to a respective one of said pads;

d. providing a first ring of bondable material on the surface of the chip encircling a limited area containing said active regions and said pads;

e. providing lands of conductive material on a surface of an insulating substrate having a coefficient of thermal expansion near that of the semiconductor material, each of said lands extending outwardly along the surface of the substrate away from a limited area corresponding to the limited area of said chip;

f. providing a ring of insulating material over the surface of the substrate about the periphery of the limited area and crossing over each of said land;

g. providing a second ring of bondable material about the top of said ring of insulating material which conforms in size and shape to the ring of bondable material on the surface of the chip;

h. positioning said chip relative to said substrate with said surface of the chip in opposed relationship to said surface of the substrate and with said first and second rings and said pads and lands in opposing relationship;

i. bonding said rings together to hermetically seal the active region of said at least one component within an area defined by said chip, said substrate and said rings, and j. bonding said pads to said lands for connecting active regions of said at least one component to lands extending from the limited area.

2. A method as defined in claim 1 further including the step of providing bumps of bondable material on at least one of the pads formed on the semiconductor device and the lands formed on the substrate for bridging the space between the surface of the chip and the surface of the substrate.

3. An article of manufacture comprising:

a. an insulating substrate;

b. a plurality of lands of conductive material positioned on a surface of the substrate in spaced-apart relationship and having end portions positioned within a limited area and arranged in a predetermined configuration, each of said lands extending outwardly from said limited area;

c. a ring of insulating material affixed to said surface and encircling said limited area with said lands passing from the limited area between the ring of insulating material and the substrate in sealing relationship;

d. a ring of bondable material formed on the upper surface of said ring of said insulating material with said ring of insulating material separating said ring of bondable material from said lands;

e. a chip of semiconductor material having at least one component defined in a surface positioned in opposed, spaced-apart relationship to the surface of the substrate;

f. a ring of bondable material formed on the surface of the chip in opposed relationship to the ring of bondable material formed on the ring of insulating material and encircling said at least one component;

g. said rings being bonded together in sealing relationship to hermetically seal said at least one component in an area defined by said chip, said substrate, and said rings;

h. and means connecting active areas of said at least one component to respective lands of conductive material.

4. An article of manufacture as defined in claim 3 wherein said means connecting include bonding pads formed on the surface of the chip in opposed relationship to the ends of the lands on said substrate, said bonding pads being connected to the active regions of said chip.

5. An article of manufacture as defined in claim 4 further including bumps of bondable material for spanning the space between the pads on the surface of the chip and the lands on the surface of the substrate.

6. An article of manufacture as defined in claim 3 wherein said insulating ring is of a material having a coefficient of thermal expansion substantially the same as the coefficient of thermal expansion of said semiconductor chip.

7. An article of manufacture as defined in claim 3 wherein said rings of bondable material are of a solder.

8. An article of manufacture as defined in claim 5 wherein said bumps are of solder.

9. An article of manufacture as defined in claim 5 wherein said bumps are of aluminum.

10. An article of manufacture as defined in claim 1 wherein said conductive lands terminate in said limited area in bonding pads.

11. An article of manufacture as defined in claim 3 wherein insulating ring is of glass.